United States Patent [19]

Straznicky et al.

[11] 4,258,273
[45] Mar. 24, 1981

[54] UNIVERSAL REGISTER

[75] Inventors: Joseph Straznicky, Los Angeles; Alexander A. Kumjian, San Francisco, both of Calif.

[73] Assignee: Hughes Aircraft Company, Culver City, Calif.

[21] Appl. No.: 960,261

[22] Filed: Nov. 13, 1978

[51] Int. Cl.³ .............. H03K 23/02; G11C 5/00; G11C 15/04
[52] U.S. Cl. .............. 307/221 R; 307/223 R; 307/272 A
[58] Field of Search .............. 307/203, 213, 289, 291, 307/221 R, 223 R, 272 A; 365/78, 154

[56] References Cited

U.S. PATENT DOCUMENTS

| | | | |
|---|---|---|---|
| 3,818,251 | 6/1974 | Hoehn | 307/272 A |
| 3,912,950 | 10/1975 | Tada | 307/272 A |
| 3,925,684 | 12/1975 | Gaskill, Jr. et al. | 307/216 X |

*Primary Examiner*—John Zazworsky
*Attorney, Agent, or Firm*—Lawrence V. Link, Jr.; W. H. MacAllister

[57] ABSTRACT

A universal register which consists of a plurality of identical emitter coupled logic (ECL) bit slices and auxiliary ECL gates adapted for fabrication on a single large scale integration (LSI) chip. Each bit slice is comprised of a master-slave flip-flop (a master latch circuit and a slave latch circuit) and an output control network which is driven by the flip-flop. Each of the latch circuits and the output control network comprises a single stage (unit propagation delay), two decision level cascode ECL circuit. The output control network selectively supplies either the Q or the $\overline{Q}$ output signal from the flip-flop or a logic zero signal to the network's output terminal (designated P). The control network responds to applied select (S) and enable ($\overline{E}$) signals so that when the S signal is at a high level (logic 1) and the $\overline{E}$ signal is at a low level (logic zero) the Q signal is fed to the P output terminal; when the $\overline{E}$ and S signals are both at a low level, the $\overline{Q}$ signal is fed to the P output terminal; and when the $\overline{E}$ signal is at a high level the signal at the P output terminal is held at the low (logic zero) level. This just described enable feature of the invention allows for "wire-OR" connection of the P output terminal from a given ECL circuit to the output terminals of other ECL circuits so as to facilitate the implementation of a variety of processor circuits, such as, for example, toggle/hold circuits, expandable counters, J-K flip-flops and shift registers.

10 Claims, 18 Drawing Figures

| Clear | Toggle Enable | Operating Mode |
|---|---|---|
| 0 | 0 | Toggle |
| 0 | 1 | Hold |
| 1 | * | Clear |

UNIVERSAL REGISTER

BACKGROUND OF THE INVENTION

This invention relates generally to registers (parallel banks of flip-flops) of the type used in digital signal processors, and more particularly to digital registers of the emitter coupled logic (ECL) family.

Master-slave flip-flops and master-slave D-registers (parallel banks of flip-flops) are used in large quantities in digital computers and digital signal processors. In these applications, flip-flops may be used with auxiliary gates and digital control circuits and in other applications registers are used to synchronize processor operation such as, for example, by capturing data from an upstream network at each edge transition of the clock signal. Also, register output signals are sometimes utilized to drive next stage networks which require true (Q), complemented ($\overline{Q}$), or both true and complemented input signals. In other cases the output signals from several registers are connected in parallel to drive a common bus, and in this application it is usually required that each of the output signals from the registers be fed to the bus through a multiplex-enable gating arrangement so that the bus is driven only by signals from a selected register at any given time. Additionally, it may be useful to feed register output signals to a bus and in parallel to separate logic networks. Normally registers, flip-flops, gates and other specialized parts are used to serve these multiple applications.

Presently, many radars and other sensor systems are produced in relatively modest (e.g., 100–1000) quantities. Consequently, to achieve even small quantity large scale integration (LSI) part application, each part must be used many times (e.g., 100 to 1000) in each processor unit. Increasing part usage improves part quality and reliability (through higher quality fabrication) and at the same time lowers parts production and amortized non-recurring costs. Increased usage can be achieved by making one part sufficiently flexible to serve in many of the hereinabove described applications. Flexibility also reduces the number of different part types needed to build a digital processor and a requirement for a small number of LSI part types can lower initial customer resistance to LSI use and in the long run reduce inventory cost.

Numerous ECL master-slave flip-flops and master-slave D-registers are available today as standard product parts. In many cases, the prior art flip-flop circuits are similar to the one illustrated in FIGS. 1a and 1b herein, but without the output control network of FIG. 1c. The output control network of the present invention is a single series gated cascode network which might be considered similar to or derivable from the universal logic gate circuits of U.S. Pat. No. 3,925,684. However, the combination of the master-slave flip-flop and the output control network in accordance with the principles of the subject invention is not believed to have been available heretofore nor disclosed in the literature.

SUMMARY OF THE INVENTION

Accordingly, it is an object of the present invention to provide a single universal LSI type part which is capable of being programmed electronically and through alternate external connections to perform most flip-flop and register functions in a digital signal processor or computer.

Another object of the invention is to provide a flip-flop/register part with output network delay performance that is usually superior to the performance of equivalent multistage networks built with available standard parts.

A further object of the present invention is to provide a single LSI type part that includes auxiliary logic gating often needed with flip-flop or other parts in digital signal processors.

Yet another object of the invention is to provide a register with a general purpose one stage output logic network that may be substituted for the next stages of driven networks built with standard parts.

A still further object of the invention is to provide a parallel bank of flip-flops with special output gating adapted to be used alone or with a few additional gates so as to implement many processor control logic circuits.

An additional object is to provide a register with built-in output multiplex-enable circuitry so that several P-output terminals need be only wired-OR connected to implement signal multiplexing.

Another object of the invention is to provide a register with independent parallel outputs so that one set of, e.g., Q, outputs may be fed to a next stage network and a second set maybe multiplex-enabled and fed to a separate parallel next stage network.

A further object of the invention is to provide a universal register with output logical inversion so that a complemented output may be fed to driven networks without intermediate complementing gates.

In accordance with these and other objects of the invention there is provided a universal register (UREG) one embodiment of which consists of 12 identical emitter coupled logic (ECL) bit slices plus 6 auxiliary ECL gates adapted for fabrication on a single LSI chip. Each bit slice is made up of a master-slave flip-flop and a single stage series gated output control network driven by the flip-flop. Each of the flip-flop's sections (master latch circuit and slave latch circuit) and the output control network comprises a single stage (unit propagation delay), two decision level cascode ECL circuit. The flip-flop's Q output signal is fed to an off-chip output terminal and in parallel to the output control network. The flip-flop's $\overline{Q}$ output signal is fed to the output control network only. The output control network (CN) selectively supplies either the Q or $\overline{Q}$ output signal from the flip-flop or a logic zero signal to the network's output terminal (designated P). The control network responds to applied select (S) and enable ($\overline{E}$) signals so that when the $\overline{E}$ signal is at a low level and the S signal is at a high level the Q signal is fed to the P output terminal; when the $\overline{E}$ and S signals are both at a low level the $\overline{Q}$ signal from the flip-flop is fed to the P output terminal; and when the $\overline{E}$ signal is high the signal at the P output terminal is held to a low or logic zero level. This last mentioned enable feature allows "wire-OR" connection of the P output terminal to other ECL circuit output terminals as described in greater detail hereinafter.

In the herein illustrated embodiment, bit slices are arranged on a LSI chip in two groups of two and two groups of four and common clock and control signals are fed in parallel to all bit slices in each group. This signal sharing implementation reduces the number of LSI chip signal pads and thus the number of package pins. The particular grouping of bit slices in 2 and 4-bit bytes permits alternate part usage with 4, 6 and 12-bit word lengths; 8, 16 and 24 bit word lengths can be accommodated also when two parts are used together.

Clock and control signal sharing reduces register LSI die size because the basic design is input/output (I/O) limited. For ECL-10K and more so for newer integrated circuit (IC) fabrication technology, fewer I/O pads would allow die size reduction. However, signal sharing reduces the efficiency of register usage in some control applications in which independent bit slice operation is sometimes required and in such cases the circuits in accordance with the subject invention may be used with one of the flip-flops not connected. The busing arrangement disclosed herein reduces usage inefficiency while also reducing I/O pin usage and LSI die size.

BRIEF DESCRIPTION OF THE DRAWINGS

The foregoing and other objects and features of the present invention can be more readily understood with reference to the following detailed description taken in conjunction with the accompanying drawings, wherein like reference numerals designate like structural elements, and in which:

FIG. 4b is a truth table which defines the operation of the circuits shown in FIG. 4a;

FIG. 6b is a truth table which defines the operation of the flip-flop illustrated in 6a;

FIG. 7a is a shift register which includes universal register bit slices of the present invention;

FIG. 7b is a truth table which defines the operation of the shift register of FIG. 7a.

DESCRIPTION OF THE PREFERRED EMBODIMENTS

Figure 1A:
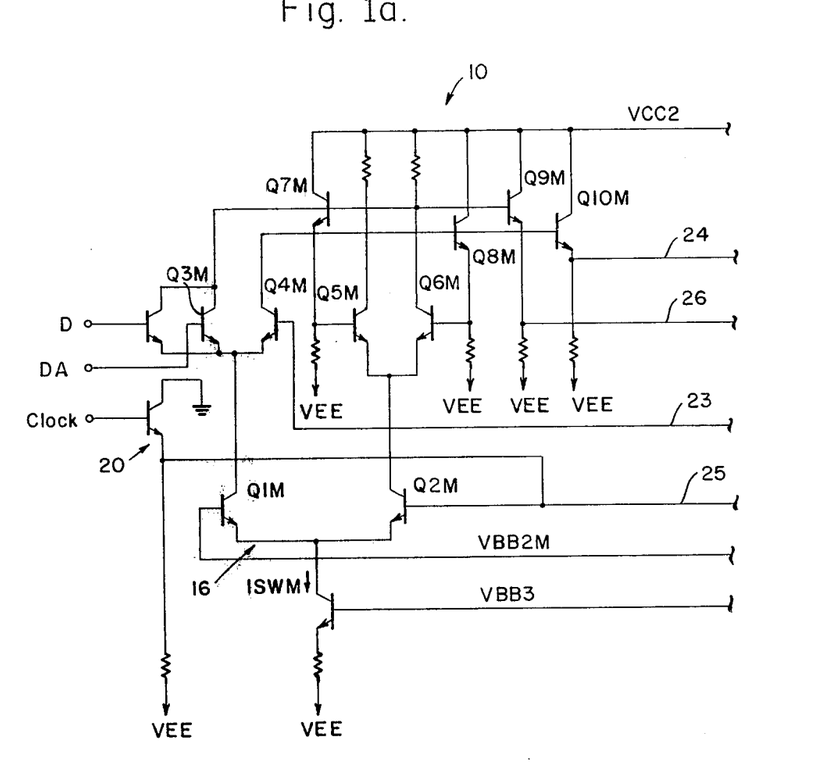
FIGS. 1a, 1b and 1c are circuit diagrams of a master latch, slave latch and output control network, respectively, which together comprise a universal register bit slice in accordance with the present invention.
Figure 1B:
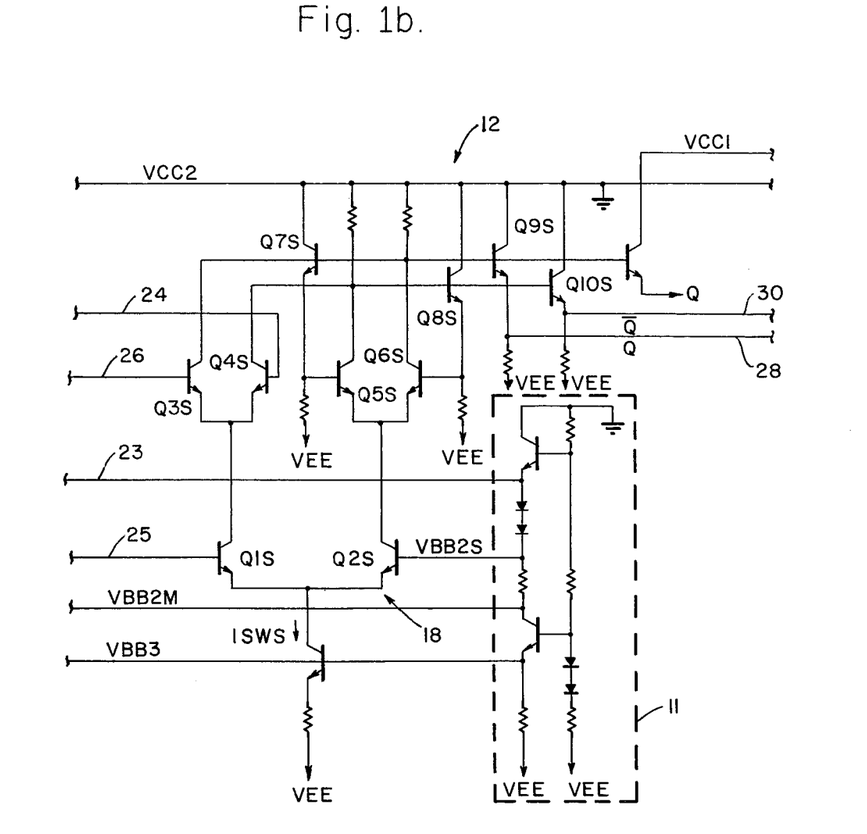
Figure 1C:
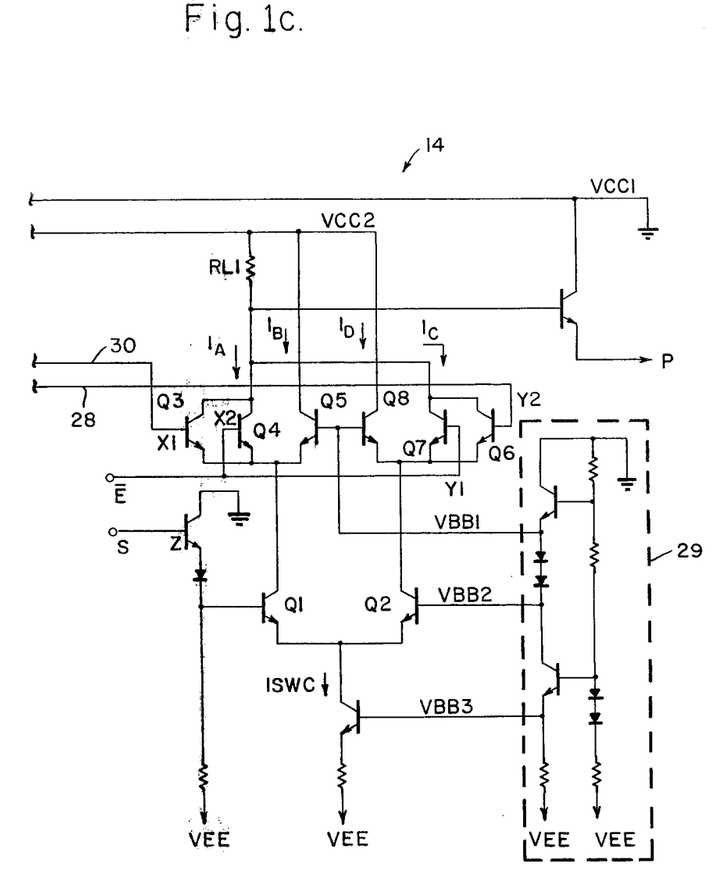

Reference is first primarily directed to FIGS. 1a, 1b and 1c which taken together depict the circuit diagram of a universal register bit slice in accordance with the principles of the subject invention. Each register bit slice is made up of a master-slave D flip-flop (FIGS. 1a and 1b) and an output control network 14 (FIG. 1c). The master-slave D flip-flop contains a master latch circuit 10 (sometimes referred to hereinafter as a master latch) shown in FIG. 1a and a slave latch circuit 12 (sometimes hereinafter referred to as a slave latch) shown in FIG. 1b. Reference voltages for the latch circuits 10 and 12 are provided by a conventional bias network 11. The latch circuits 10 and 12 are almost identical, however, the reference voltage VBB2M fed to the lower current switch 16 of the master latch 10 is approximately 100 millivolts (mV) lower than the reference voltage VBB2S fed to lower current switch 18 of the slave latch 12. In addition, a clock signal which is applied through level shifting circuit 20 is fed to one side of the lower current switch 16 of master latch 10 and to the opposite side of the lower current switch 18 of slave latch 12. When the applied clock signal is at a low level, e.g., 1.7 V switch current ISWM flows through transistor QIM of the master latch 10. Transistors Q3M and Q4M form an active differential pair and track the signal supplied to the D input terminal of master latch 10. When the applied clock signal is at a low level, the switch current ISWS of the slave latch 12, flows through transistor Q2S and transistors Q5S and Q6S in conjunction with the emitter followers of transistors Q7S and Q8S form an active latch circuit.

When the clock signal is at high level, current ISWM flows through transistor Q2M of the lower current switch 16 of masterlatch 10 and transistors Q5M and Q6M in conjunction with the emitter followers of transistors Q7M and Q8M form a latch circuit. When the applied clock signal is at a high level, the switch current ISWS flows through the transistor Q1S in the slave latch 12 so that the differential transistor configuration of Q3S and Q4S is controlled by signals applied on leads 24 and 26 from the master latch 10 to the slave latch 12. Consequently, the output signals from master latch 10 are fed through the slave latch 12 to the Q and Q̄ signal leads designated 28 and 30, respectively.

The master, slave operation takes place at transistions of the clock signals due to the offset between the reference voltages VBB2M and VBB2S applied to the lower current switches 16 and 18, respectively. When the applied clock signal is at a low level, the master latch 10 passes input data (applied at terminals D or DA) directly through to the slave latch 12 which unit ignores the data and slave latch 12 remains latched to a data state determined by the previously applied input data. As the clock signal rises, the master latch 10 latches its output data (on leads 24 and 26) to values determined by the input data and as the clock signal rises further the slave latch 12 releases and passes the data then latched into the master latch 10 to the output leads 28 and 30 of the slave latch 12. The above described operating sequence, whereby the master latch 10 acquires the newly applied data and then the slave latch releases previously held data, insures that the output data from the master slave flip-flop (the combination of units 10 and 12) will change only if the new data stored in the master latch 10 differs from the data that was previously stored in the slave latch 12.

As the applied clock signal falls the slave latch 10 first latches to the data state as determined by the output data of the master latch 10 and then as the clock signal falls still further the master latch 10 releases, acquires and tracks its new input data. The just described operating sequence, i.e., the slave latch 12 latches and then the master latch 10 releases insures that data stored in the master latch will be captured in the slave latch before the master latch is released to acquire the new data. The input data to master latch 10 is derived as the logical OR function of the data applied to the D and DA input terminals (left-hand side of FIG. 1a). The data applied to the DA input terminal may be used, for example, to initialize each of the stages of a register which comprises a plurality of universal register bit slices.

The output control network 14 of FIG. 1c is a single series gated, two decision level cascode circuit. When the select (S) signal applied to a Z input terminal (the base) of transistor 32 is at a high level (approximately 0.4 V above VBB1) switch current ISWC flows through transistor Q1 and when the signal applied to the Z input terminal of transistor 32 is at a low level (approximately 1.7 V, for example) the switch current ISWC flows through transistor Q2. Thus, when the signal applied to the Z input terminal is equal to 1 (high) current flows through transistors Q3, or Q4 if either of the signals applied to terminal X1 or X2 is equal to 1 (high); if both of the signals applied to terminals X1 and X2 are equal to zero (low) the current ISWC flows through transistor Q5. The terminals X1 and X2 are coupled to the base of transistors Q3 and Q4, respectively, and they receive the signal $\overline{Q}$ and $\overline{E}$, respectively. When the signal applied to the Z input terminal is equal to zero (low) current flows through transistors Q6 and Q7 if either of the signals applied to terminals Y1 and Y2 is equal to 1 (high) and the current passes through transistor Q8 if the signals applied to terminals Y1 and Y2 are both equal to zero (low). The terminals Y1 and Y2 are coupled to transistors Q7 and Q6, respectively, and they receive the signals $\overline{E}$ and Q, respectively.

Because the collectors of transistors Q3, Q4, Q6 and Q7 are wire-AND connected, the signal at a P output terminal (designated the P output signal) will be at a low level whenever current $I_A$ or $I_C$ is conducted through load resistor RL1; otherwise the P output signal is at the high level. Currents $I_B$ and $I_D$ are returned directly to the lead designated VCC2 because in the illustrated embodiment the complement output signal $\overline{P}$ is not needed. Reference voltages for the output control netword 14 are provided by a conventional bias network 29.

The Boolean expressions for currents $I_A$, $I_B$, $I_D$ and $I_C$ may be derived in a straight forward manner through an analysis of current flow through the circuit of FIG. 1c. In each equation, the function is a logic 1 if current is flowing and a logic zero otherwise. Specifically, $$I_A = Z(X_1 + X_2), I_B = Z(\overline{X_1 = X_2}), I_D = \overline{Z}(Y_1 + Y_2);$$
$$I_C = \overline{Z}(Y_1 + Y_2)$$

Thus output signal P=0 and $\overline{P}$ (not implemented)=1 when $I_A + I_C = 1$, i.e., when $$\overline{P} = Z(X_1 + X_2) + \overline{Z}(Y_1 = Y_2). \qquad \text{Equation (1)}$$

Equivalently, P=1 and $\overline{P}$=0 whenever $I_A + I_C = 0$, i.e., when $I_B + I_D + 1$. Thus, $$P = Z(\overline{X_1 + X_2}) + \overline{Z}(\overline{Y_1 + Y_2}). \qquad \text{Equation (2)}$$

Equation 2 above may be derived from equation 1 by complementing both sides of equation 1 and then simplifying.

Figures 2A, 2C:
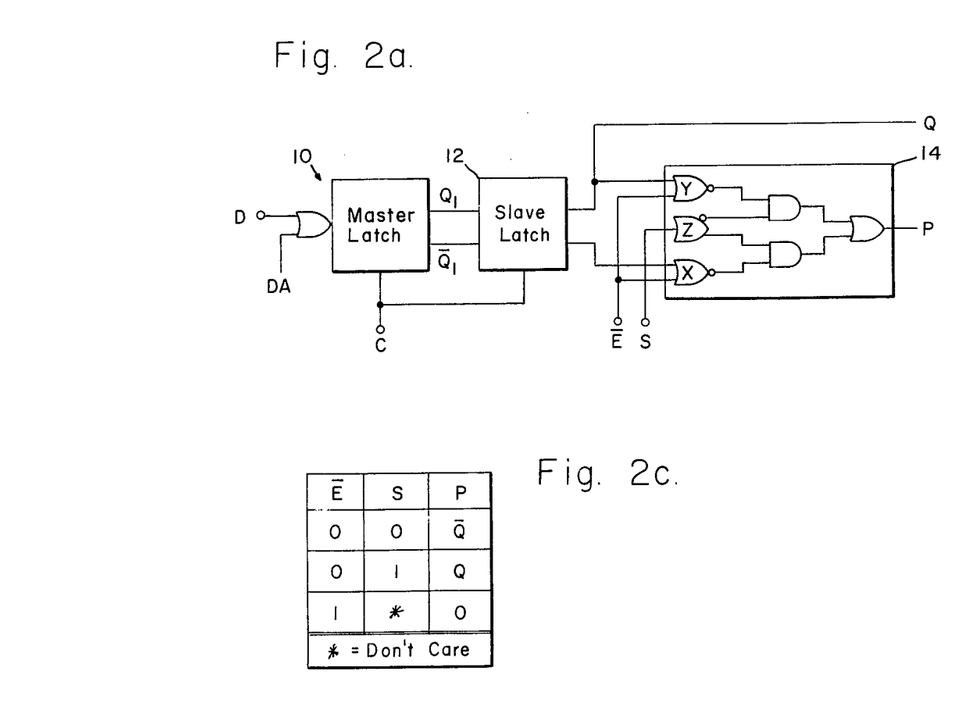
FIGS. 2a, 2b and 2c are a logic diagram, a logic symbol diagram, and a truth table, respectively, for the universal register bit slice shown in FIGS. 1a, 1b and 1c.
Figure 2B:
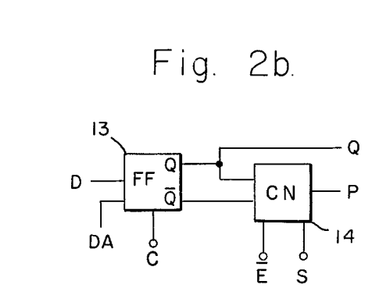

FIG. 2a depicts the equivalent logic diagram for the bit slice shown in FIGS. 1a, 1b and 1c; FIG. 2b is a logic symbol thereof; and a truth table which defines operation of the output control network 14 is presented in FIG. 2c. In FIG. 2b the master latch 10 and the slave latch 12 are shown as a master-slave flip-flop 13. It is noted that the output control network 14 in FIG. 2a is the "logical" equivalent, not the "literal" equivalent, of the output control network 14 shown in FIG. 1c. As is evident from the truth table of FIG. 2c, the output control network 14 passes either the Q or $\overline{Q}$ signal which is applied from master latch 10 (FIG. 1a) or a logic zero signal to the P output terminal. When the select input signal (S) is at the high level and the complement enable input signal $\overline{E}$ is at the low level, the Q signal is passed to P output terminal; when the S and $\overline{E}$ signals are both at the low level, the signal $\overline{Q}$ is passed. When the $\overline{E}$ signal is at the high level (E is low) the signal at the P output terminal is forced to the low level and this feature allows wire-OR connection of the P output terminal with, for example, the output terminals from other registers for signal multiplexing.

One primary application for digital registers is the capture of internal processor data and digital registers are typically used at the output of a functional module to hold the results of the modules data manipulation for use during a subsequent clock cycle. In such application, the P output terminals of several registers may be connected to a single bus and in accordance with the subject invention when this is done appropriate gating of the applied $\overline{E}$ signal causes the contents of a selected register to be passed on to the bus. In some applications it is desirable to send only certain bits of the contents of a register onto a given bus and such "bit masking" can also be accommodated with $\overline{E}$ gating and usually requires no more gates than are present in the register itself.

Figure 3A:
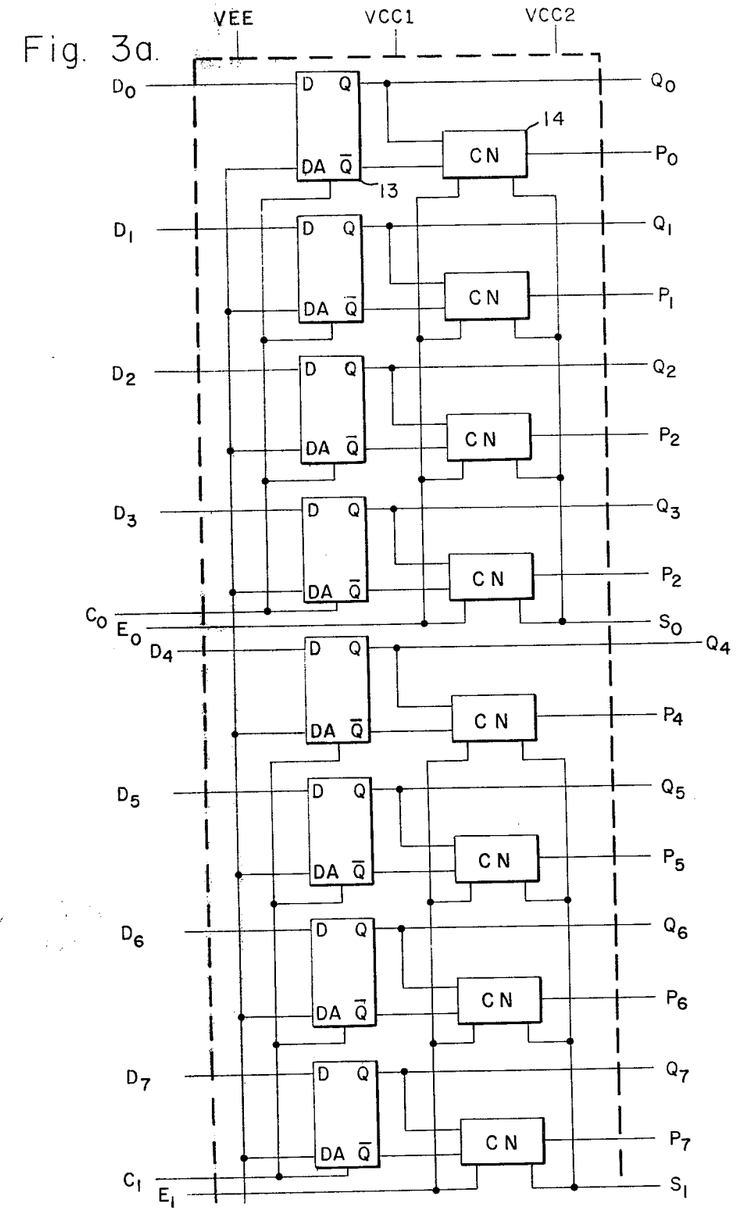
FIGS. 3a and 3b comprise a logic diagram of a LSI universal register in accordance with the principles of the present invention.
Figure 3B:
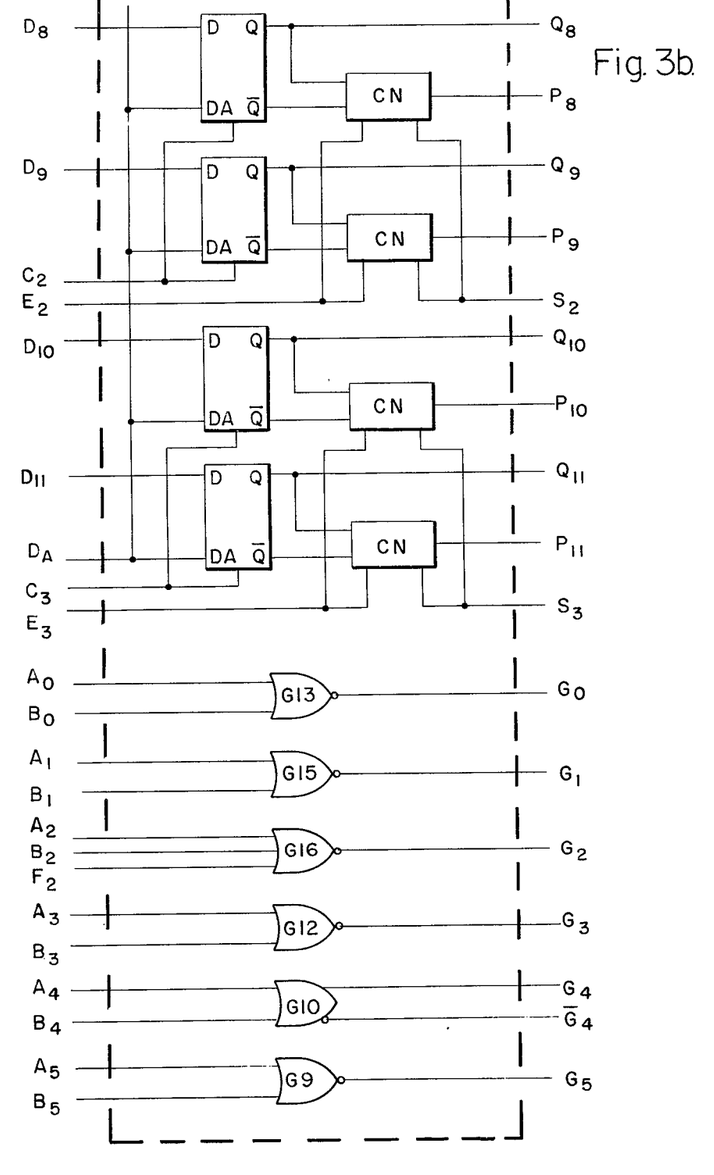
Figure 8:
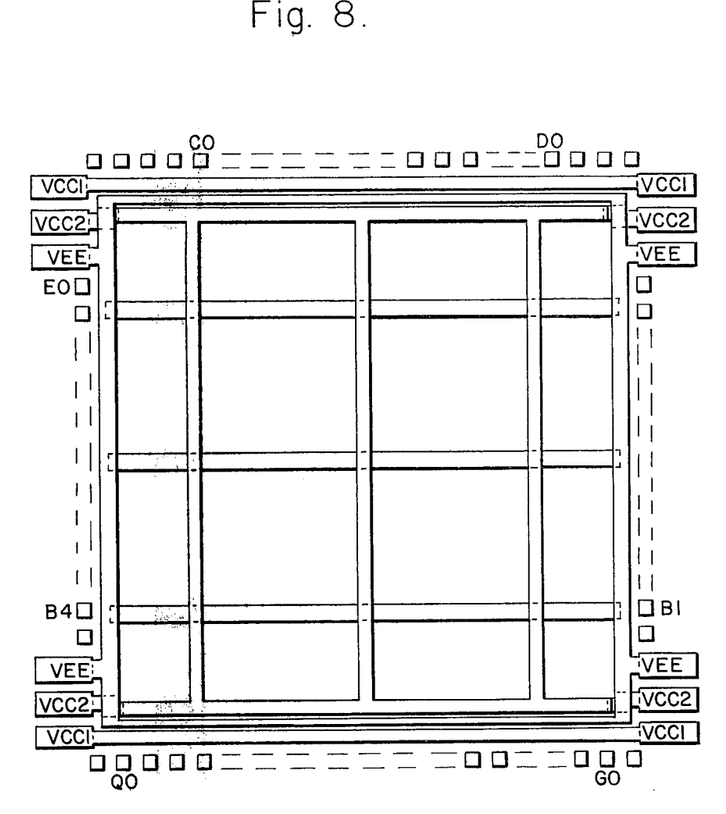
FIG. 8 illustrates signal pad assignments for the universal register of FIGS. 3a and 3b.

As shown in FIGS. 3a and 3b, taken together, one embodiment of a universal register in accordance with the subject invention comprises 12 ECL bit slices and 6 auxiliary ECL gates. Each of the register bit slices is comprised of a master-slave flip-flop 13 and an output control network (CN) 14 (see FIG. 2b). The bit slices are arranged in two groups of two (FIG. 3b) and two groups of four (FIG. 3a) with common clock signals and control signals being applied in parallel to all the bit slices in each of the respective groups. This signal sharing reduces the number of LSI signal pads (FIG. 8) and thus the number of package pins. In the illustration of FIGS. 3a and 3b, the bit slices are identified by twelve subscripts 0 through 11. For example, the first bit slice from the left in FIG. 3a has a data input signal designated $D_O$, the Q output signal from the associated master-slave flip-flop 13 is designated $Q_O$ and the output signal from the associated output control network 14 is designated $P_O$. The DA input terminals for all twelve of the bit slices shown in FIGS. 3a and 3b are connected in parallel whereby as mentioned hereinabove all of the stages of the register may be set to the logic one state by applying a high level signal to the $D_A$ bus. In FIG. 3b, the 6 auxillary ECL gates are designated by the reference designators G9, G10, G12, G13, G15 and G16. The inputs to the auxiliary ECL gates are designated by the letters A or B or F with number subscripts and the outputs from the auxiliary ECL gates are designated by the letter G with numerical subscripts. The power supply voltages VEE, VCC1 and VCC2 are symbollically depicted as being applied to the left of FIG. 3a. The particular grouping of bit slices into 2 and 4-bit bytes shown in FIGS. 3a and 3b, permits alternate part usage of 4, 6 and 12-bit word lengths; 8, 16 and 24-bit word lengths can be accommodated also when two parts are used together. The input/output pad assignment for an illustrative LSI chip layout is shown in FIG. 8 wherein the pads are given designations similar to the signal designations of FIGS. 3a and 3b, except that subscripts are not used in identifying the pads. For example, the signal $D_O$ listed in FIG. 3a is applied to pad $D_O$ shown in FIG. 8. It is noted that in the interest of clarity of the drawing only a few representative pads designations are shown in FIG. 8. However, it should be understood that for each of the input and output signals indicated in FIGS. 3a and 3b there is an associated pad in the arrangement of FIG. 8.

Figure 4A:
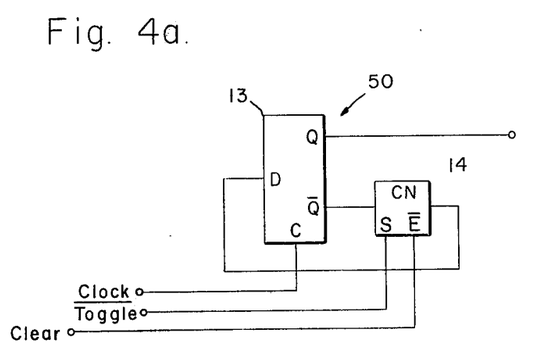
FIG. 4a is a block diagram of a toggle/hold circuit which includes a universal register bit slice in accordance with the present invention.
Figure 4B:
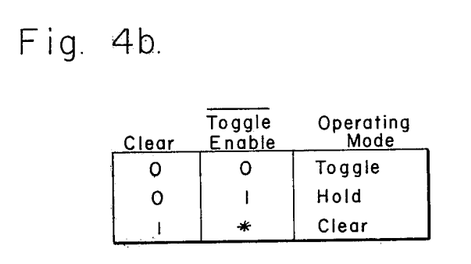

FIGS. 4a through 7b depict applications for universal register bit slices in accordance with the present invention. FIG. 4a to which reference is now primarily directed, depicts a toggle/hold circuit 50 which is made from a universal register bit slice. In this configuration, which includes the synchronous clear function, the select (S) input signal causes either the present state of the $\overline{Q}$ output signal or its complement to be fed back into the D input of master-slave flip-flop 13. When the present state is fed back (S=1) the circuit holds its state; and when the complement state is fed back (S=0), toggling takes place. A logic "1" on the $\overline{E}$ control terminal forces a "logic 0" to the D input thereby clearing the circuit on the next clock transition. FIG. 4b is a truth table showing the logic function implemented by the circuit of FIG. 4a. A potential disadvantage to the circuit of FIG. 4a for register bit slice arrangements such as those shown in FIGS. 3a and 3b arises due to the sharing of control signals. This disadvantage results inasmuch as at least one other register bit slice shares control inputs with the bit slice use of the toggle/hold circuit and the output gating of said other bit slice (sharing bit slice) is strictly constrained. However, the second bit slice (sharing bit slice) is still available for use as part of a holding register or for a controlled register using specific output gating.

Figure 5:
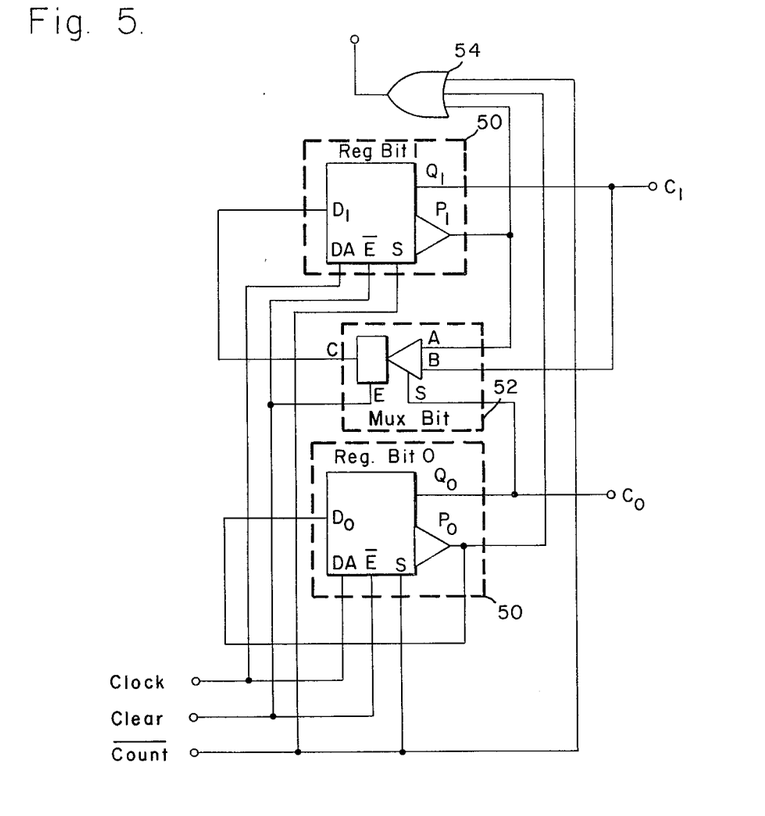
FIG. 5 is a block diagram of a two bit expandable counter which includes universal register bit slices of the present invention.

Expansion of the toggle/hold circuit of FIG. 4a in binary counters can be accomplished by combining the universal register of the present invention with multiplexer such as, for example, the universal multiplexer described in U.S. patent application Ser. No. 960,259 entitled "Universal Multiplexer" by Joseph Straznicky and filed concurrently herewith. In the two bit expandable counter shown in FIG. 5, a multiplexer 52 and an OR-gate 54 are combined with two universal register bit slices (each of which are designated 50). It is noted that the multiplexer of the just cited application has a "D" output which is not used in the embodiment of FIG. 5 and is not shown therein. The operating mode of this circuit are the same as for the toggle/hold circuit described above except that the $\overline{\text{TOGGLE}}$ signal has been renamed $\overline{\text{COUNT}}$. In the count mode, the $\overline{\text{COUNT}}$ signal is at the low level, the CLEAR signal is also at the low level and the bit 0 register toggles. When the signal $Q_0$ is at the high level (logic one state), the multiplexer 52 gates the complement of signal $Q_1$ into the $D_1$ terminal of register bit slice 1 thereby causing register bit one to toggle. A low level signal (logic 0) at the $Q_0$ terminal of register bit slice 0 causes the signal $Q_1$ to be fed into $D_1$ so that register bit slice 1 holds its state. An overflow bit, generated as the "OR" function of the signals $Q_0$, $Q_1$ and $\overline{\text{COUNT}}$, provides the appropriate signal for the $\overline{\text{COUNT}}$ input of a succeeding counter stage. In the hold or clear mode, the signal $Q_2$ or zero is fed into the $D_2$ input terminal of the next stage (not shown) with the same results as described hereinabove.

Figure 6A:
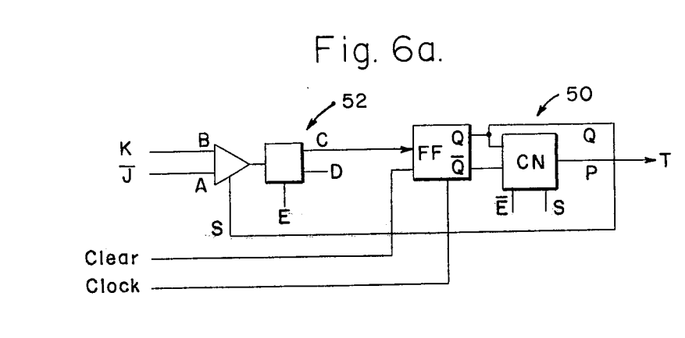
FIG. 6a is a block diagram of a J-K̄ flip-flop which incorporates a universal register bit slice in accordance with the present invention.
Figure 6B:
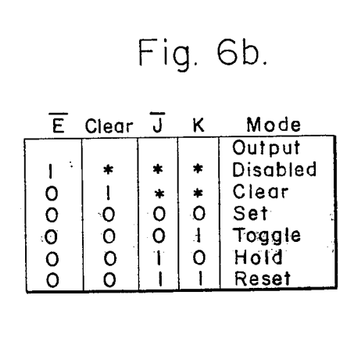
Figure 6C:
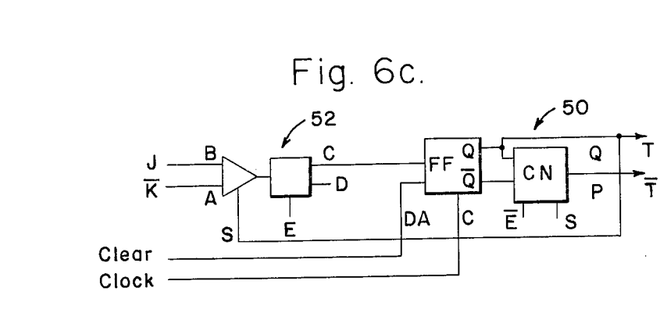
FIG. 6c is a J-K̄ flip-flop which incorporates a universal register bit slice in accordance with the present invention.
Figure 6D:
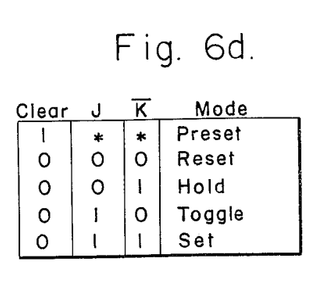
FIG. 6d is a truth table which defines the operation of the flip-flop shown in FIG. 6c.

A J-K or J-$\overline{\text{K}}$ flip-flop also can be constructed using a universal register bit slice in conjunction with a multiplexer bit and implementation of these circuits is shown in FIGS. 6a and 6c, respectively. FIGS. 6b and 6d are truth tables which define the logical operation of the circuits of FIGS. 6a and 6c, respectively. For both J-K flip-flop circuits, the multiplexer 52 presents the required input signals to the register's (50) data input terminal for realization of the given truth table. The output of multiplexer 52 labeled "D" is not used in the embodiments of FIGS. 6a, 6c and 7c.

Figures 7A, 7B:
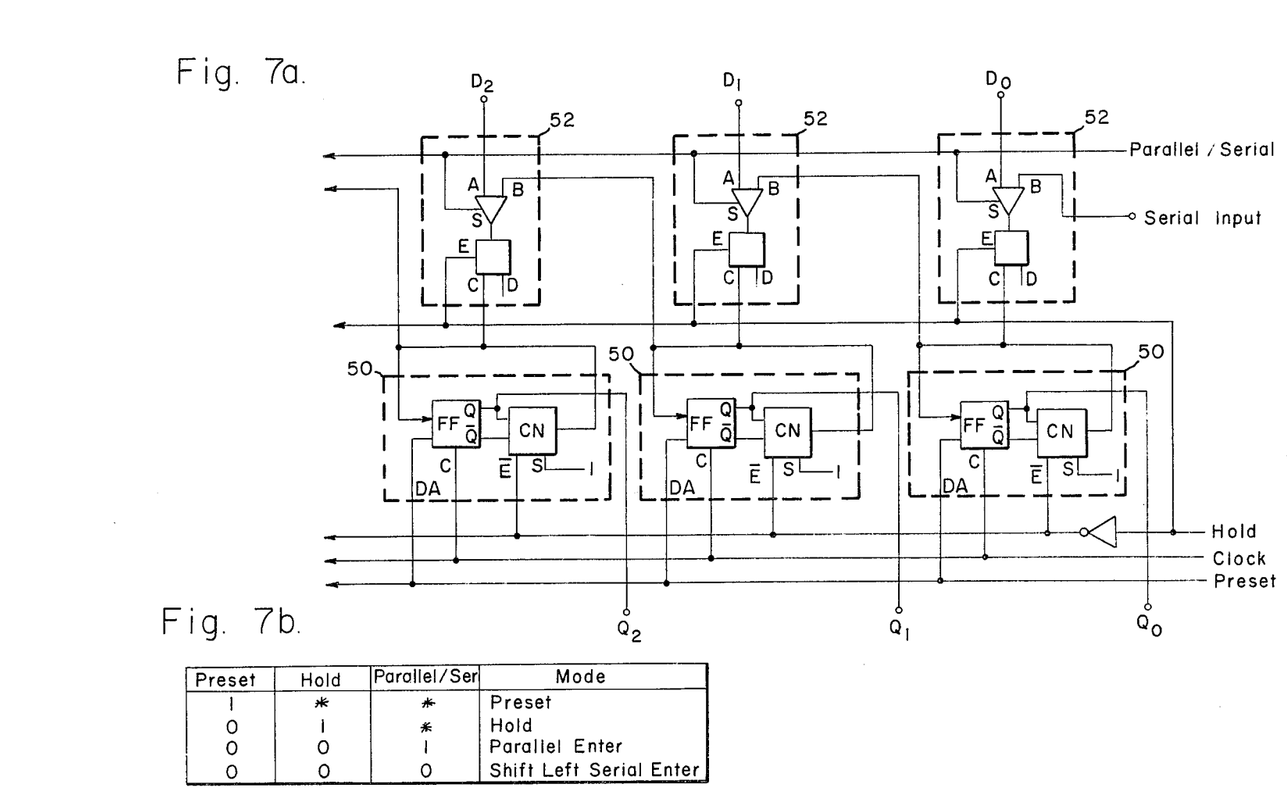

FIG. 7a illustrates a shift register having parallel or serial input, preset and hold modes which may be realized with universal registers in accordance with the subject invention and multiplexers. The operating modes which result from the various input signals states are shown in the truth table of FIG. 7b. The synchronous preset control overrides all other controls and may be used for system synchronization. The hold signal takes precedence over the parallel/serial signal and causes the existing signal state to be fed back into the register bit slices while disabling the multiplexers selection between parallel and serial inputs.

Thus, having described a new and useful universal register what is claimed is:

1. A register adapted for processing applied binary data signals as a function of applied control signals, said register comprising a plurality of bit slices each of which comprises:
    a master-slave flip-flop having a master latch circuit adapted for receiving at least one applied data signal and a slave latch circuit coupled in cascade with said master latch circuit and adapted for producing two complementary output signals that are indicative of the binary state of the applied data signal;
    an output control network coupled in cascade with said slave latch circuit and adapted for receiving the applied control signals so as to selectively provide as a function of said control signals, an output signal which is equal to one of said two complementary output signals from said slave latch circuit or is equal to a predetermined binary signal state; and
    wherein said master latch circuit, said slave latch circuit and said output conrol network each comprise a single stage, two decision level cascode, emitter coupled logic circuit.

2. The register of claim 1 wherein for each bit slice the two complementary output signals produced by said slave latch circuit are designated Q and $\overline{Q}$; said control signals are designated S and $\overline{E}$; said output control network has an output terminal designated P and includes means for responding to said S and $\overline{E}$ signals such that when the S signal is at a logic one level and the $\overline{E}$ signal is at a logic zero level the Q signal is applied to the P output terminal, when the S and $\overline{E}$ signals are both at a logic zero level the $\overline{Q}$ signal is applied to the P output terminal and when the $\overline{E}$ signal is at a logic one level a logic zero signal is applied to the P output terminal.

3. The register of claim 1 wherein for each bit slice said master-slave flip-flop and said output control network both respond to applied clock signals and said bit slices are arranged on a large scale integration chip in groups such that common clock and control signals are applied in parallel to all bit slices in each group.

4. The register of claim 3 further comprising a plurality of auxiliary emitter coupled logic gates on said large scale integration chip.

5. The register of claim 3 wherein said bit slices are arranged in two groups of two bit slices each and two groups of four bit slices each.

6. The register of claim 4 wherein there are twelve bit slices and six auxiliary emitter coupled logic gates disposed on said chip such that said bit slices are in two groups of two bit slices each and two groups of four bit slices each.

7. The register of claim 3 wherein each said master latch circuit has two input terminals for receiving applied data signals and means for processing the data signals applied to said two input terminals in accordance with the logic OR function.

8. The register of claim 7 wherein one of the two input terminals for each of the plurality of bit slices are connected together.

9. The register of claim 2 wherein for each bit slice said master-slave flip-flop and said output control network both respond to applied clock signals and said bit slices are arranged on a large scale integration chip in groups such that common clock and control signals are applied in parallel to all bit slices in each group.

10. The register of claim 9 further comprising a plurality of auxiliary emitter coupled logic gates on said large scale integration chip.

* * * * *